(12) United States Patent
Stadler et al.

(10) Patent No.: US 11,869,830 B2
(45) Date of Patent: Jan. 9, 2024

(54) SEMICONDUCTOR PACKAGE AND CLIP WITH A DIE ATTACH

(71) Applicant: Infineon Technologies AG, Neubiberg (DE)

(72) Inventors: Michael Stadler, Munich (DE); Thomas Bemmerl, Schwandorf (DE)

(73) Assignee: Infineon Technologies AG, Neubiberg (DE)

( * ) Notice: Subject to any disclaimer, the term of this patent is extended or adjusted under 35 U.S.C. 154(b) by 68 days.

(21) Appl. No.: 16/678,000

(22) Filed: Nov. 8, 2019

(65) Prior Publication Data

US 2020/0152554 A1  May 14, 2020

(30) Foreign Application Priority Data

Nov. 9, 2018 (DE) ..................... 10 2018 128 109.9

(51) Int. Cl.
| | |
|---|---|
| *H01L 23/31* | (2006.01) |
| *H01L 23/495* | (2006.01) |
| *H01L 23/00* | (2006.01) |
| *H01L 21/48* | (2006.01) |

(52) U.S. Cl.
CPC .... *H01L 23/49517* (2013.01); *H01L 21/4828* (2013.01); *H01L 23/3121* (2013.01); *H01L 23/49541* (2013.01); *H01L 23/49582* (2013.01); *H01L 24/83* (2013.01); *H01L 2224/83815* (2013.01)

(58) Field of Classification Search
CPC .......... H01L 23/49517; H01L 23/3121; H01L 23/49582; H01L 23/49541
See application file for complete search history.

(56) References Cited

U.S. PATENT DOCUMENTS

| | | | |
|---|---|---|---|
| 4,942,452 A | 7/1990 | Kitano et al. | |
| 5,083,186 A | 1/1992 | Okada et al. | |
| 6,191,494 B1 * | 2/2001 | Ooyama | H01L 23/3107 257/676 |
| 6,242,284 B1 * | 6/2001 | Kang | H01L 23/49827 438/126 |
| 6,667,541 B1 | 12/2003 | Minamio et al. | |
| 7,348,663 B1 * | 3/2008 | Kirloskar | H01L 23/49548 257/710 |
| 7,443,012 B2 * | 10/2008 | Yamaguchi | H01L 23/3128 257/667 |
| 7,939,933 B2 * | 5/2011 | Itou | H01L 21/561 257/676 |
| 8,674,487 B2 * | 3/2014 | Yu | H01L 21/4832 257/676 |

(Continued)

FOREIGN PATENT DOCUMENTS

| | | |
|---|---|---|
| CN | 1251943 | 5/2000 |
| JP | 2006-114571 | 4/2006 |

*Primary Examiner* — Eugene Lee
(74) *Attorney, Agent, or Firm* — Dicke, Billig & Czaja, PLLC

(57) ABSTRACT

A clip, a semiconductor package, and a method are disclosed. In one example the clip includes a die attach portion having a first main face and a second main face opposite to the first main face, and at least one through-hole extending between the first and second main faces and including a curved transition from an inner wall of the at least one through-hole to the first main face.

17 Claims, 3 Drawing Sheets

(56) References Cited

U.S. PATENT DOCUMENTS

| | | | |
|---|---|---|---|
| 8,710,609 B2* | 4/2014 | Zitzlsperger | H01L 21/4842 |
| | | | 257/E31.117 |
| 2002/0160552 A1* | 10/2002 | Minamio | H01L 23/3107 |
| | | | 438/108 |
| 2003/0075785 A1 | 4/2003 | Crowley et al. | |
| 2006/0284291 A1 | 12/2006 | Joshi et al. | |
| 2007/0267727 A1 | 11/2007 | Hu et al. | |
| 2009/0194856 A1* | 8/2009 | Gomez | H01L 24/11 |
| | | | 257/675 |
| 2010/0019368 A1* | 1/2010 | Shin | H01L 24/24 |
| | | | 257/686 |
| 2011/0193208 A1* | 8/2011 | Xue | H01L 24/83 |
| | | | 257/676 |
| 2011/0227205 A1 | 9/2011 | Lu et al. | |
| 2012/0129300 A1* | 5/2012 | Lin | H01L 23/49827 |
| | | | 438/122 |
| 2013/0181351 A1* | 7/2013 | Yang | H01L 24/24 |
| | | | 257/762 |
| 2013/0249103 A1 | 9/2013 | Fukui | |
| 2014/0191380 A1* | 7/2014 | Lee | H01L 23/49503 |
| | | | 257/676 |
| 2014/0306328 A1 | 10/2014 | Mikado et al. | |
| 2015/0262918 A1 | 9/2015 | Tran et al. | |
| 2016/0300782 A1* | 10/2016 | Chen | H01L 23/3114 |
| 2017/0148746 A1* | 5/2017 | Chiu | H01L 24/97 |
| 2017/0365542 A1* | 12/2017 | Essig | H01L 24/25 |
| 2018/0053712 A1 | 2/2018 | St. Germain et al. | |
| 2019/0067212 A1* | 2/2019 | Cadag | H01L 23/49548 |
| 2019/0122969 A1* | 4/2019 | Lee | H01L 21/565 |
| 2019/0267310 A1* | 8/2019 | Rodriguez | H01L 24/32 |
| 2019/0318987 A1* | 10/2019 | Lin | H01L 23/3121 |
| 2020/0303288 A1* | 9/2020 | Hishiki | H01L 23/49541 |

* cited by examiner

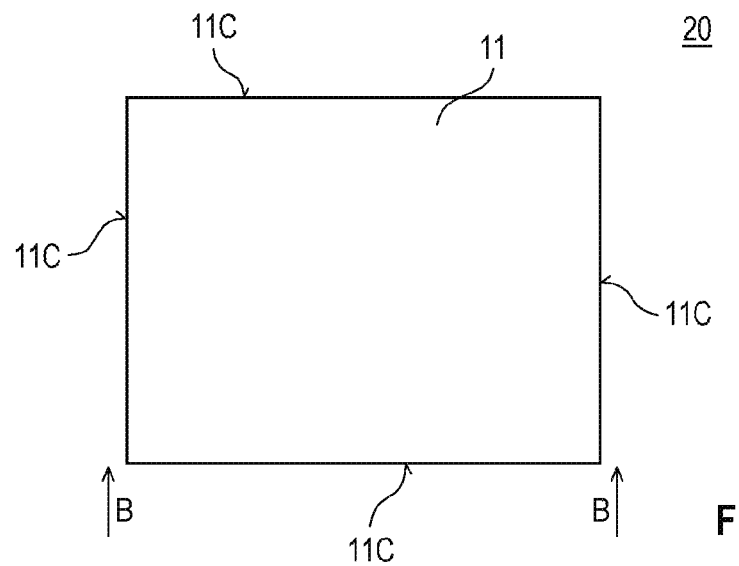
Fig. 2A
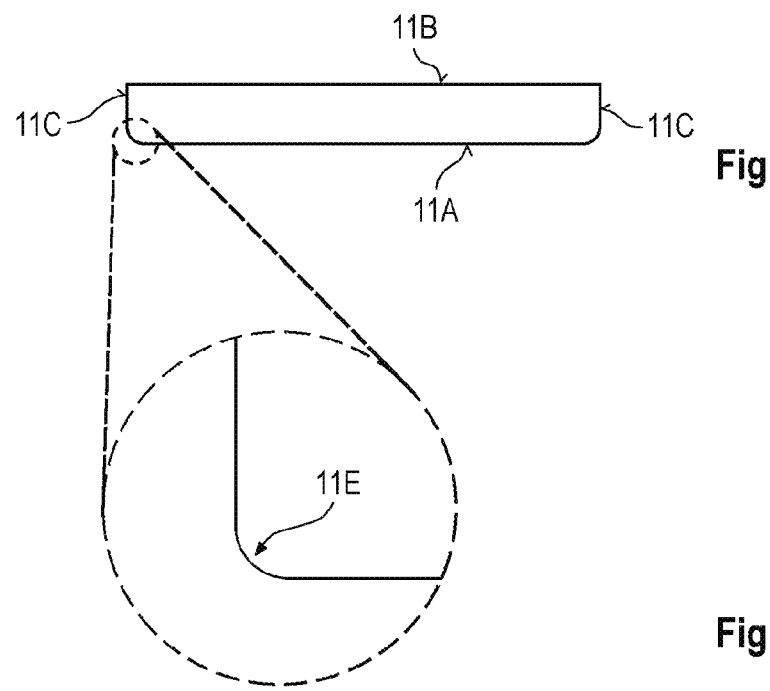
Fig. 2B
Fig. 2C

US 11,869,830 B2

SEMICONDUCTOR PACKAGE AND CLIP WITH A DIE ATTACH

CROSS-REFERENCE TO RELATED APPLICATION

This Utility Patent Application claims priority to German Patent Application No. 10 2018 128 109.9, filed Nov. 9, 2018, which is incorporated herein by reference.

TECHNICAL FIELD

The present disclosure relates to a clip, a semiconductor package, and a method for fabricating a semiconductor package.

BACKGROUND

A typical semiconductor package may include various components such as a leadframe, a semiconductor die, a clip, a heatsink, different types of bonds, and an encapsulant. Very often these and other components are coupled together using solder or a similar viscous substance. The soldering process may be performed by application of a specific solder material in the form of, for example, a solder paste to one or more functional interfaces of the components to be connected, and performing soldering, in particular by a reflow process and subsequent cooling and thereby transforming the solder material into a solid and connecting the components together.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts.

FIG. 2 comprises FIG. 2A to 2C and shows an example of a clip in a down view (A), a side view (B), and an enlarged side view of the curved transition (C).

DETAILED DESCRIPTION OF THE DRAWINGS

Figure 1A:
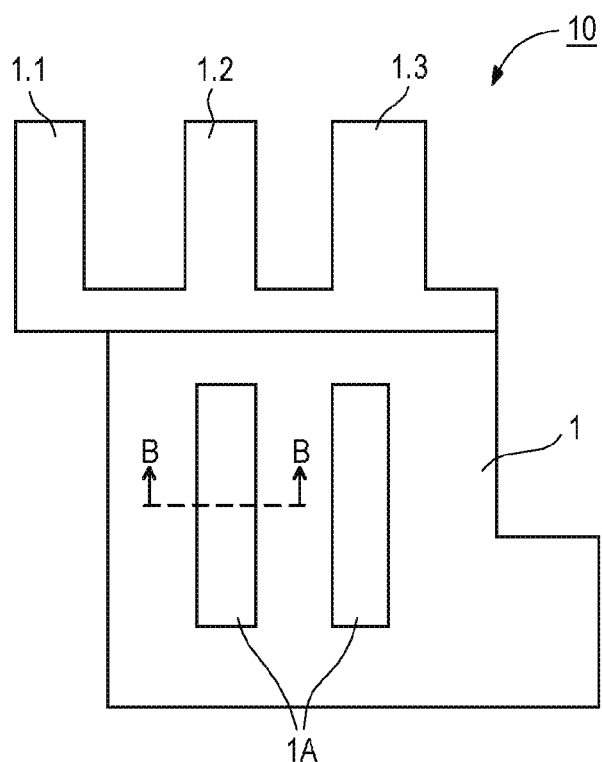
FIG. 1 comprises FIGS. 1A and 1B and shows an example of a clip according to the first aspect in a down view (A), and a partial cross-sectional side view (B) along line B-B in FIG. 1A of the clip together with a semiconductor die and a solder material in between the clip and the semiconductor die for illustrating also the functional effect.

A first aspect of the present disclosure relates to a clip. The clip comprises a die attach portion comprising a first main face and a second main face opposite to the first main face, and at least one through-hole extending between the first and second main faces and comprising a curved transition from an inner wall of the at least one through-hole to the first main face.

It has turned out that in soldering processes as those described above, it may happen that voids are created in the solder material during the reflow process. If such voids would remain in the finished solder layer, they could have a potentially harmful influence on the mechanical and electrical performance of the chip-to-clip or chip-to-leadframe connection. Therefore efforts should be made to remove these voids during the reflow process. As will be shown in more detail later, the through-hole formed in the die attach portion, fulfils the function of an escape channel for voids. Moreover it can be shown that the curved edge allows the voids to more easily and more smoothly move into the through-hole and along an outer contour of the clip. In contrast thereto, sharp edges would act as barriers for the voids due to capillary forces. The curved edge serves to reduce such capillary forces.

According to an embodiment of the clip of the first aspect, the cross section of the curved transition comprises a circular arc segment comprising a non-zero radius R. According to further embodiment thereof the non-zero radius R is in a range from 0.05 mm to 0.5 mm, more specifically from 0.1 mm to 0.4 mm, more specifically from 0.2 mm to 0.3 mm. Alternatively, the cross section of the curved transition may follow any other first or higher order continuously differentiable shape such as a parabola or a spline curve or a chamfer with variable chamfer angle.

According to an embodiment of the clip of the first aspect, the curved edge is formed by an etching process. For example, by etching an originally sharp edge can be transformed into a curved edge. The etching parameters can be selected such that a desired radius R of the curved transition will be obtained. Alternatively, the curved edge may be manufactured by a punching or a coining process.

According to an embodiment of the clip of the first aspect, at least one through-hole comprises the form of at least one elongated slot. According to a further embodiment thereof the at least one through-hole comprises the form of two parallel elongated slots. Also other forms of one or more slots are possible as, for example, non-parallel slots, one or more crossed forms, one or more circles, one or more S-like forms or other curved forms.

According to an embodiment of the clip of the first aspect, the clip comprises a base body comprising Cu, a Cu alloy, or a compound material comprising Cu and at last one further metal. According to a further embodiment thereof, a layer is disposed on a main face of the base body, wherein the layer is comprised of another metallic material than the material of the base body. According to a further embodiment thereof the material of the layer comprises Ni or Ag or respective alloys thereof.

According to an embodiment of the clip of the first aspect, the clip comprises a composite material stack, combining conductive and non-conductive materials.

According to an embodiment of the clip of the first aspect, the clip comprises a thickness in a range from 100 µm to 2 mm. The thickness of the clip is defined as the distance between the two main surfaces of the clip.

According to an embodiment of the clip of the first aspect, a minimum lateral dimension of the through-hole is in the order of the thickness of the clip. For example, in case of a slot the minimum lateral dimension corresponds to the width of the slot which can be in the order of the thickness of the clip or greater.

A second aspect of the present disclosure relates to a clip comprising a die attach portion comprising a first main face, a second main face opposite to the first main face, side faces extending between the first and second main faces, and a curved transition from a side face to the first main face.

According to further embodiments of the clip of the second aspect, the clip and in particular the curved transition may be formed according to any one of the embodiments as described above in connection with a clip of the first aspect.

A third aspect of the present disclosure relates to a semiconductor package. The semiconductor package comprises a die pad, a semiconductor die comprising a first main face and a second main face opposite to the first main face, the semiconductor die being attached with its first main face to the die pad by means of a first solder layer, and a clip comprising a die attach portion comprising a first main face and a second main face opposite to the first main face, and at least one through-hole extending between the first and second main faces and comprising a curved transition from an inner wall of the at least one through-hole to the first main face, or a clip comprising a die attach portion comprising a first main face, a second main face opposite to the first main face, side faces extending between the first and second main faces, and a curved transition from a side face to the first main face, wherein the clip is attached with the first main face of the die attach portion to the semiconductor die by means of a second solder layer, and an encapsulation layer component the semiconductor die and the die attach portion of the clip.

According to further embodiments of the semiconductor package of the third aspect, the clip may be formed according to any one of the embodiments as described above in connection with a clip of the first or second aspects.

According to a further embodiment of the semiconductor package of the third aspect, in case of a clip having a through-hole, at least one through-hole is at least partly filled with material of the second solder layer. According to an embodiment thereof, the through-hole is only partly filled with the solder material. Furthermore it may be that it is filled with the solder material in such a way that due to capillary forces the filling level is higher at the inner wall of the through-hole than in the center. As a result the surface of the filled in solder material may comprise a parabolic form in a lateral cross-section.

A forth aspect of the present disclosure relates to a method for fabricating a semiconductor package. The method comprises providing a die pad, providing a semiconductor die comprising a first main face and a second main face opposite to the first main face, attaching the semiconductor die with its first main face to the die pad by means of a first solder layer, providing a clip comprising a die attach portion comprising a first main face and a second main face opposite to the first main face, and at least one through-hole extending between the first and second main faces and comprising a curved transition from an inner wall of the through-hole to the first main face or a clip comprising a die attach portion comprising a first main face, a second main face opposite to the first main face, side faces extending between the first and second main faces, and a curved transition from a side face to the first main face, attaching the clip with the first main face of the die attach portion to the semiconductor die by means of a second solder layer, and encapsulating the semiconductor die and the die attach portion of the clip with an encapsulation layer.

According to an embodiment of the method of the forth aspect, attaching the clip to the semiconductor die comprises applying a solder material on one or more of the first main face of the die attach portion of the clip and the first main face of the semiconductor die, and performing a solder process so that the solder material is transformed into the second solder layer. According to a further embodiment thereof, applying the solder material comprises dispensing the solder material.

According to an embodiment of the method of the forth aspect the solder material comprises a solder paste containing a flux material. Alternatively, the solder material may also comprise a flux-free solder paste. In general, it should be mentioned at this point that the method according to the third aspect can in principle be carried out with every kinds of solder materials.

According to an embodiment of the method of the third aspect providing the clip comprises fabricating the at least one through-hole by etching.

In the following detailed description, reference is made to the accompanying drawings, in which are shown by way of illustration specific aspects in which the disclosure may be practiced. In this regard, directional terminology, such as "top", "bottom", "front", "back", etc., may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concept of the present disclosure is defined by the appended claims.

In addition, while a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements co-operate or interact with each other regardless whether they are in direct physical or electrical contact, or they are not in direct contact with each other; intervening elements or layers may be provided between the "bonded", "attached", or "connected" elements. Also, the term "exemplary" is merely meant as an example, rather than the best or optimal.

The examples of a semiconductor package and a method for fabricating a semiconductor package may use various types of semiconductor dies or circuits incorporated in the semiconductor dies, among them power MOS transistors, power Schottky diodes, JFETs (Junction Gate Field Effect Transistors), power bipolar transistors, logic integrated circuits, analogue integrated circuits, power integrated circuits, chips with integrated passives, etc. The examples may also use semiconductor dies comprising MOS transistor structures or vertical transistor structures like, for example, IGBT (Insulated Gate Bipolar Transistor) structures or, in general, transistor structures in which at least one electrical contact pad is arranged on a first main face of the semiconductor die and at least one other electrical contact pad is arranged on a second main face of the semiconductor die opposite to the first main face of the semiconductor die. Moreover, the examples of insulation materials may, for example, be used for providing insulation layers in various types of enclosures and insulation for electrical circuits and components, and/or for providing insulation layers in various types of semiconductor dies or circuits incorporated in semiconductor dies, including the above mentioned semiconductor dies and circuits.

The semiconductor die(s) of the semiconductor package can be manufactured from specific semiconductor material, for example Si, SiC, SiGe, GaAs, GaN, or from any other semiconductor material, and, furthermore, may contain one or more of inorganic and organic materials that are not semiconductors, such as for example insulators, plastics or metals.

The semiconductor die(s) considered herein may be thin, in particular thinner than 100 µm, 50 µm, 20 µm, or 10 µm. In order to allow handling or manipulation of the semiconductor die, e.g. handling/manipulation required for packaging, or semiconductor device assembly, the semiconductor chip may form part of a composite chip. A composite chip may comprise the semiconductor chip and a reinforcing chip secured to the semiconductor chip. The reinforcing chip adds stability and/or strength to the composite chip to make it manageable.

The semiconductor die(s) may have contact pads (or electrodes) which allow electrical contact to be made with the integrated circuits included in the semiconductor chip(s). The electrodes may be arranged all at only one main face(s) of the semiconductor chip(s) or at both main faces of the semiconductor chip(s). They may include one or more electrode metal layers which are applied to the semiconductor material of the semiconductor chip(s). The electrode metal layers may be manufactured with any desired geometric shape and any desired material composition. For example, they may comprise or be made of a material selected of the group of Cu, Ni, NiSn, Au, Ag, Pt, Pd, an alloy of one or more of these metals, an electrically conducting organic material, or an electrically conducting semiconductor material.

The semiconductor package may comprise an encapsulation material forming an encapsulation body which encapsulates the clip and the semiconductor die. The encapsulation material may be electrically insulating. The encapsulation material may comprise or be made of any appropriate ceramic, plastic or polymer material such as, e.g., a duroplastic, thermoplastic or thermosetting material or laminate (prepreg), and may e.g. contain filler materials. Various techniques may be employed to encapsulate the semiconductor chip(s) with the encapsulation material, for example compression molding, injection molding, powder molding, liquid molding or lamination. Heat and/or pressure may be used to apply the encapsulation material.

In several examples layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD, etc.

Figure 1B:
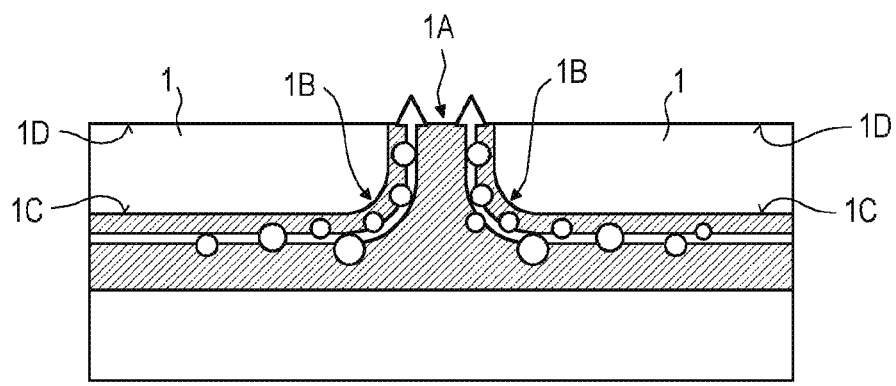

FIG. 1 comprises FIGS. 1A and 1B and shows an example of a clip according to the first aspect and its functionality. The clip 10 of FIG. 1 comprises a die attach portion 1 comprising a first main face 1C and a second main face 1D opposite to the first main face 1C, and two slots 1A extending between the first and second main faces 1C and 1D and each comprising a curved transition 1B from an inner wall to the first main face. In other words, each one of the slots 1A comprises a round or curved edge or fillet 1B between its inner wall and the first main face 1C of the clip 10.

The first main face 1C of the clip 10 is the one onto which a semiconductor die has to be attached by means of a solder material and a reflow process turning the solder material into a solder layer. During the reflow process undesirable voids can be formed which are schematically represented as spheres of different size in FIG. 1B. FIG. 1B furthermore illustrates the process of extracting the voids which are propagating upwards through the liquid solid material during the reflow process (indicated by wide arrows). The voids can move unobstructed around the smooth edges 1B. However, if the edges were sharp, they act as barriers to void movement due to capillary forces.

As further indicated by the wide arrows, the voids flow upwards through the solder material and pass out of the solder material into the interior of the reflow oven. The reflow process can be carried out at normal pressure in the reflow oven, hence a vacuum is not required. However, it is also possible to arrange for an at least reduced pressure or even a (moderate) vacuum inside the reflow oven which would then further assist in the extraction of the voids.

The solder material can in principle be any conventional solder material. In particular, the solder material can be a paste-based solder or a wire based solder. Besides that, the solder material may be based on or contain one or more of the following elements or compounds: Pb, Sn, Ag, PbSn, SnAg. The solder material can also be Pb free. Besides the above, the solder material may or may not contain a flux or any other similar auxiliary agent.

As shown in FIG. 1, the clip may further comprise leads 1.1, 1.2, and 1.3 which may be connected to the die attach portion 1 and which are intended to function as external leads of the finished electronic device.

It should be mentioned that the first aspect of the present disclosure is not necessarily restricted to a clip, but could also be realized in other types of contact elements like, for example, a leadframe, a lead of a leadframe, a heatsink (e.g. exposed heatsink soldered on top of a clip) or a die pad.

FIG. 2 comprises FIG. 2A to 2C and shows an example of a clip according to the second aspect and its functionality. The clip 20 of FIG. 2 comprises a die attach portion 11 comprising a first main face 11A and a second main face 11B opposite to the first main face 11A, and side faces 11C extending between the first and second main faces 11A and 11B, and a curved transition 11E from a side face to the first main face. More specifically, in case of a rectangular clip 20, there are four side faces 11C extending between the first and second main faces 11A and 11B, and preferably at each one of the four side faces 11C there is provided a curved transition 11E.

The curved transition 11E may be configured in the same way as the curved transition 1B of the clip 10 as shown in FIG. 1 and it may comprise the same features or properties as were described above. The functionality is similar as that shown in FIG. 1B whereas in case of the clip 20 during the reflow process the voids are moving along the first main face 11A towards the side faces 11C and then move unobstructed around the curved transition 11E until they finally escape the liquid solder material.

It should further be mentioned that the two embodiments of clips 10 and 20 as shown in FIGS. 1 and 2 can also be combined with each other. The clip may thus comprise at least one through-hole comprising a curved transition and also curved transitions between side faces and a first main faces.

Figure 3:
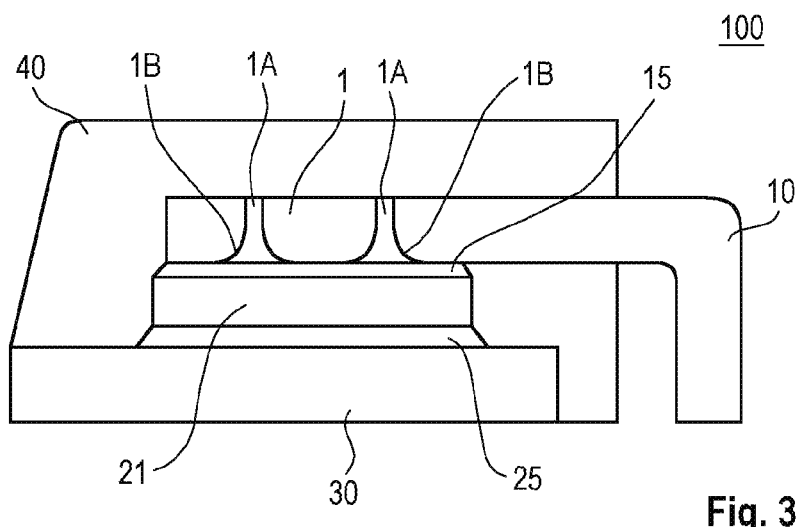
FIG. 3 shows an example of a semiconductor package according to the third aspect in a schematic cross-sectional side view, the semiconductor package comprising a clip according to the first aspect.

FIG. 3 shows an example of a semiconductor package according to the second aspect. The semiconductor package 100 comprises a die pad 30, a semiconductor die 21 comprising a first main face and a second main face opposite to the first main face, the semiconductor die 21 being attached with its first main face to the die pad 30 by means of a first solder layer 25, and a clip 10 such as that shown and described above in connection with FIG. 1.

Accordingly the clip 10 comprises a die attach portion 1 comprising a first main face and a second main face opposite to the first main face, and two slots 1A extending between the first and second main faces and comprising a curved transition from an inner wall to the first main face. The clip 10 is attached with the first main face of the die attach portion 1 to the semiconductor die 21 by means of a second solder layer 15.

The semiconductor package 100 further comprises an encapsulation 40 encapsulating the semiconductor die 21 and the die attach portion 1 of the clip 10. The encapsulation 40 may comprise any one of the materials as were listed above, in particular a resin like, for example, an epoxy resin.

It should be noted that the semiconductor package could also be configured such that it comprises a clip 20 as was shown in FIG. 2 and described in the accompanying description.

Figure 4:
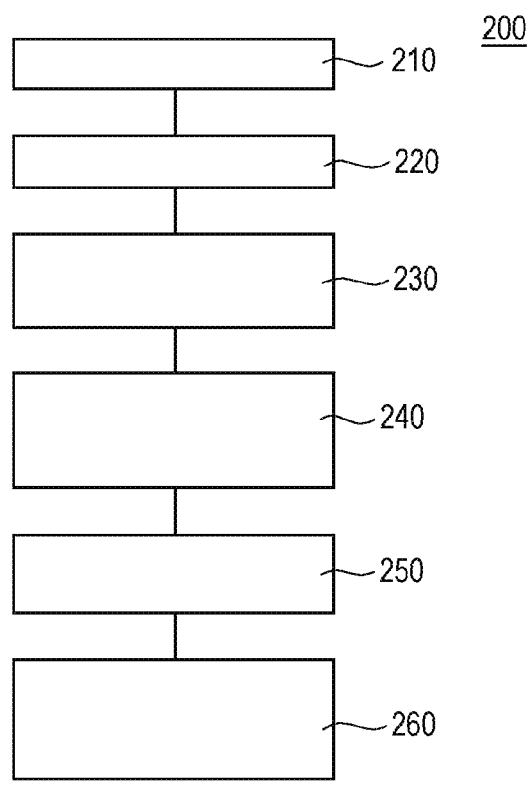
FIG. 4 shows an example of a flow diagram for illustrating a method for fabricating a semiconductor package according to the third aspect.

FIG. 4 shows an example of a flow diagram for illustrating a method for fabricating a semiconductor package according to the third aspect.

The method 200 of FIG. 4 comprises providing a die pad (210), providing a semiconductor die comprising a first main face and a second main face opposite to the first main face (220), attaching the semiconductor die with its first main face to the die pad by means of a first solder layer (230), providing a clip comprising a die attach portion comprising a first main face and a second main face opposite to the first main face and at least one through-hole extending between the first and second main faces and comprising a curved transition from an inner wall of the through-hole to the first main face (240), attaching the clip with the first main face of the die attach portion to the semiconductor die by means of a second solder layer (250), and encapsulating the semiconductor die and the die attach portion of the clip with an encapsulant (260).

The method of FIG. 4 can in particular be implemented in such a way as to fabricate a semiconductor package as shown in FIG. 2 and described above.

The first and second solder layers 15 and 25 can be equal, similar or different, i.e. they can be based on equal, similar, or different elements or compounds.

Attaching the semiconductor die to the die pad can be performed by applying, in particular dispensing, a first solder material, in particular a first solder paste, to one or both of the semiconductor die and the die pad and thereafter disposing the semiconductor die onto the die pad with the first solder material between them. Thereafter a second solder material, in particular a second solder paste, can be applied, in particular dispensed, to one or both of the semiconductor die and the clip and thereafter the clip is disposed onto the semiconductor die with the second solder material between them. Thereafter the resulting stack is placed in a reflow oven in which a reflow process is carried out followed by a cooling step. As a result, the first and second solder materials are transformed into first and second solder layers and the semiconductor die is permanently attached to the die pad and the clip is attached to the semiconductor die. It is also possible that another solder process than a reflow process is carried out.

Although the disclosure has been shown and described with respect to one or more implementations, equivalent alterations and modifications will occur to others skilled in the art based at least in part upon a reading and understanding of this specification and the annexed drawings. The disclosure includes all such modifications and alterations and is limited only by the concept of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application.

What is claimed is:

1. A clip comprising:
a die attach portion comprising a first major surface and a second major surface opposite said first major surface, and at least one through hole extending between said first and second major surfaces, wherein said at least one through hole comprises an inner wall and a convex curved transition surface between said inner wall and said first major surface, and wherein said convex curved transition surface has in a lateral cross-section a circular arc segment having a radius R unequal to zero.

2. The clip according to claim 1, wherein
the non-zero radius R is within a range of 0.05 mm to 0.5 mm.

3. The clip according to claim 1, wherein
said at least one through hole comprises the shape of at least one elongated slot.

4. The clip according to claim 3, wherein
said at least one through hole being in the form of two parallel elongate slots.

5. The clip according to claim 1, comprising:
a base body comprising Cu, a Cu alloy or a composite material comprising Cu and at least one other metal.

6. The clip according to claim 1, wherein
said at least one through hole having the shape of at least one circle, at least one ellipse, at least one rectangle, at least one rectangle, at least one rectangle with rounded corners, at least one polygon or a composition of the above mentioned shapes.

7. The clip according to claim 1, comprising:
at least one lead attached to the die attach portion.

8. A clip comprising:
a die attach portion comprising a first major surface and a second major surface opposite said first major surface, and at least one through hole extending between said first and second major surfaces, wherein said at least one through hole comprises an inner wall and a convex curved transition surface between said inner wall and said first major surface, and wherein said convex curved transition surface has in a lateral cross-section a circular arc segment having a radius R unequal to zero; and a plurality of leads attached to the die attach portion.

9. The clip according to claim 8, wherein
the non-zero radius R is within a range of 0.05 mm to 0.5 mm.

10. The clip according to claim 8, wherein
said at least one through hole comprises the shape of at least one elongated slot.

11. The clip according to claim 10, wherein
said at least one through hole being in the form of two parallel elongate slots.

12. The clip according to claim 8, comprising:
a base body comprising Cu, a Cu alloy or a composite material comprising Cu and at least one other metal.

13. The clip according to claim 8, wherein
said at least one through hole having the shape of at least one circle, at least one ellipse, at least one rectangle, at least one rectangle, at least one rectangle with rounded corners, at least one polygon or a composition of the above mentioned shapes.

14. A clip comprising:
a die attach portion comprising a first major surface and a second major surface opposite said first major surface, and at least one through hole extending between said first and second major surfaces, wherein an edge between an inner wall of said at least one through hole and said first major surface has a curved transition having in a lateral cross-section a circular arc segment having a radius R unequal to zero; and a plurality of leads attached to the die attach portion,
wherein said at least one through hole comprises the shape of at least one elongated slot, and
wherein said at least one through hole being in the form of two parallel elongate slots.

15. The clip according to claim 14 wherein
the curved transition comprises a curved convex transition.

16. The clip according to claim 14, wherein
the non-zero radius R is within a range of 0.05 mm to 0.5 mm.

17. The clip according to claim 14, comprising:
a base body comprising Cu, a Cu alloy or a composite material comprising Cu and at least one other metal.

* * * * *

UNITED STATES PATENT AND TRADEMARK OFFICE
CERTIFICATE OF CORRECTION

| | | |
|---|---|---|
| PATENT NO. | : 11,869,830 B2 | Page 1 of 1 |
| APPLICATION NO. | : 16/678000 | |
| DATED | : January 9, 2024 | |
| INVENTOR(S) | : Stadler et al. | |

It is certified that error appears in the above-identified patent and that said Letters Patent is hereby corrected as shown below:

In the Claims

Column 9, Line 19, delete "at least one rectangle, at least one rectangle" and insert in place thereof --at least one rectangle--.

Signed and Sealed this
Twelfth Day of March, 2024

Katherine Kelly Vidal
*Director of the United States Patent and Trademark Office*